United States Patent [19]

Gibson

[11] Patent Number: 4,704,726
[45] Date of Patent: Nov. 3, 1987

[54] FILTER ARRANGEMENT FOR AN AUDIO COMPANDING SYSTEM

[75] Inventor: John J. Gibson, Mercer, N.J.

[73] Assignee: RCA Corporation, Princeton, N.J.

[21] Appl. No.: 595,536

[22] Filed: Mar. 30, 1984

[51] Int. Cl.⁴ .................... H04H 5/00; H03G 7/00
[52] U.S. Cl. ................................ 381/13; 381/106; 358/144; 333/14
[58] Field of Search ............ 381/106, 94, 13, 4; 358/144, 143; 333/14

[56] References Cited

U.S. PATENT DOCUMENTS

| | | | |
|---|---|---|---|
| 4,048,654 | 9/1977 | Wegner | 358/144 |
| 4,272,788 | 6/1981 | Ogita | 381/3 |
| 4,356,510 | 10/1982 | Nakayawa | 358/144 |
| 4,498,055 | 2/1985 | Dolby | 333/14 |
| 4,577,226 | 3/1986 | Avins | 381/13 |

OTHER PUBLICATIONS

Electronic Industries Association, "Compandor Complexity Analysis", Dec. 1983.
Compandor Complexity Analyses published by Broadcast Television Systems Committee of the Electronic Industries Association, Dec. 12, 1983.
Supplement to Multichannel Television Sound Report, vol. IA, IIA, dated Dec. 5, 1983, pp. 19-23.

*Primary Examiner*—Forester W. Isen
*Attorney, Agent, or Firm*—Paul J. Rasmussen; Peter M. Emanuel; Ronald H. Kurdyla

[57] ABSTRACT

A companding system for a television audio apparatus includes a compressor and an expander for stereo difference signals. The compressor provides variable preemphasis of high frequency signal components and the expander provides complementary variable deemphasis. At the receiver, unwanted signals are generated by a mixer that demodulates the stereo difference signal. The unwanted signals can cause mistracking of the expander relative to that of the compressor. A filter to eliminate the effect of these unwanted signals is placed in the expander control circuit, rather than the difference signal path. This eliminates the need and expense of an equalizing filter in the sum signal path.

16 Claims, 7 Drawing Figures

FILTER ARRANGEMENT FOR AN AUDIO COMPANDING SYSTEM

BACKGROUND OF THE INVENTION

The present invention relates to an expander for a compander system, and more particularly for a compander used for the transmission and reception of multichannel sound signals.

In the United States it has been proposed to transmit a television signal having stereo audio components. In one proposed system, known as the "Zenith" system, an L−R signal representing the difference between left (L) and right (R) stereo signals is transmitted as an amplitude modulated (AM) suppressed carrier at twice the horizontal scanning frequency. To maintain compatibility with existing monophonic (mono) receivers, the monaural signal, which consists of the L+R sum signal, is transmitted as a frequency modulated (FM) carrier in the conventional fashion. In a television receiver, the L+R and L−R signals are demodulated and then matrixed (added) to produce L and R signals. It has also been proposed to transmit an audio signal for a so called "second audio program" (SAP), e.g., for providing the main program in a second language. In the "Zenith" system, a frequency modulated carrier at five times the horizontal frequency is used for the SAP. For a more complete description of the Zenith system see pages 110-111 of "Television Multichannel Sound", Vol IA published by the National Association of Broadcaster, Nov. 9, 1983; and also U.S. Pat. No. 4,339,772.

For both the L−R and SAP signals it is also proposed to use a so called "dbx" companding system in which variable preemphasis (compression) of high frequency components at the transmitter and complementary deemphasis (expansion) at the receiver is used in order to improve the signal-to-noise (S/N) ratio of the corresponding reproduced signals. The "dbx" companding system is described in detail in the publication entitled "Compandor Complexity Analyses" published by the Broadcast Television Systems Committee of the Electronic Industries Assocication (Supplement of Dec. 5, 1983). Basically, the purpose of providing substantial high frequency content in the transmitted signal is that it has been found that the greater the high frequency content of a transmitted signal the less perceptible will be noise (i.e., the more noise will be masked).

A companding system is not used for the L+R signal since, if it were, the ability of existing receivers to properly reproduce monaural signals would be disturbed. Furthermore, the L+R signal is less subject to being contaminated by interference than the L−R or SAP signals.

Unfortunately, due to the presence at the input of the expander of undesired signals having frequencies above the audio band, as will be explained below in detail, the deemphasis in the receiver will not match or be complementary to the preemphasis in the transmitter. Thus, the received audio signal will not be restored to its original level. In addition, the phase shifts caused by the preemphasis and deemphasis circuits will also no longer be complementary. In the case of stereo reproduction, this results in reduced stereo separation since the L−R and L+R signals when matrixed will not combine to produce the proper L and R signals.

It has been proposed to use a filter in the audio signal path of the L−R expander in order to remove the undesired signals. However, this requires the use of a filter in the L+R audio path that matches the filter in the L−R path in amplitude and phase response in order to maintain stereo separation. The use of two filters is expensive, and the requirement that they be matched requires the use of close tolerance filter components, which further increases the cost of the filters.

SUMMARY OF THE INVENTION

In accordance with a feature of the present invention, in an expander with a variable filter for controlling the amplitude of signal components in a high frequency range of an L−R signal in response to a control signal and a control circuit for generating the control signal in response to the amplitude of signal components in the high frequency range of the transmitted L−R signal, a filter is provided in the control circuit (and not in the signal processing path) to greatly reduce the amount of amplitude control the variable filter provides in response to undesired components. Since the filter is in the control circuit and not in the L−R audio signal path, no matching filter is required in the L+R audio signal path or in the compressor of the transmitter.

DETAILED DESCRIPTION OF THE DRAWINGS

Figure 1:
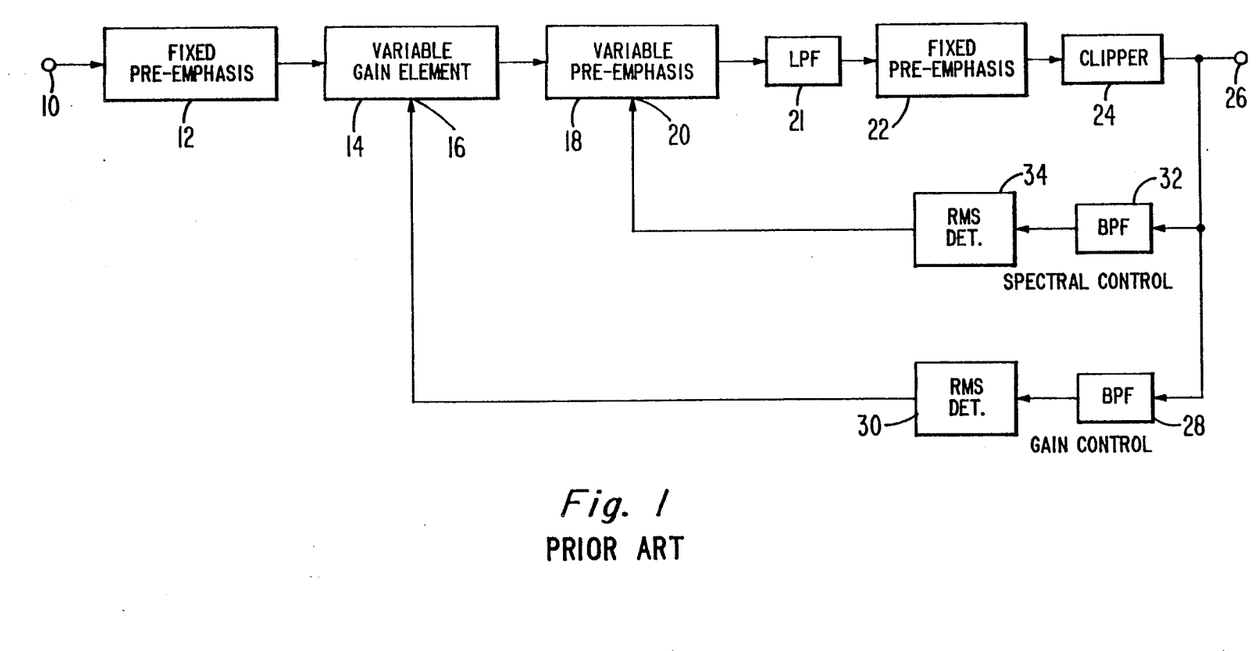
FIG. 1 is a block diagram of the compressor used in companding system for which an expander constructed in accordance with the invention is intended.

As shown in FIG. 1, input terminal 10 is provided to receive an audio signal, such as the L−R or SAP audio signal to be compressed. The audio signal is applied to fixed preemphasis circuit 12 which emphasizes signal components with frequencies above about 400 Hz. The preemphasized signals from circuit 12 are applied to variable gain element 14 comprising a variable gain amplifier (VCA) and which has a gain control input 16. Amplifier 14 provides 2:1 wideband compression, e.g., an output signal with a 50 db dynamic range is provided in response to an input signal with a 100 db dynamic range. The compressed output signal of amplifier 14 is applied to a variable preemphasis circuit 18 which has a control input 20. Variable preemphasis circuit 18 varies the gain (both amplification and attenuation) of high frequency signal components. Variable preemphasis circuit 18 in combination with fixed preemphasis circuit 12 provides a so-called "spectral control" function which is described in greater detail below. The output signal of circuit 18 is applied to lowpass filter (LPF) 21 having a 15 kHz cutoff frequency to prevent transmission of inaudable audio frequency signals. The filtered signal is applied to a fixed preemphasis circuit 22 having a time constant of 73.5 μS to preemphasize the signal for proper FM transmission. The output signal of circuit 22 is applied to clipper 24, which is set at a point equivalent of 100 percent modulation to prevent over modulation of the transmitted signal.

If desired, LPF 21 can be placed at the output of clipper 24 with the output of LPF 21 coupled to output terminal 26 as well as the inputs of BPFs 32 and 28. This has the advantage that spurious signals generated by clipper 24 are bandlimited before being applied to the modulator.

The output signal of clipper 24 is applied to a so called "wideband" gain control circuit including bandpass filter (BPF) 28 and root-mean-square (RMS) detector 30. BPF 28 has a passband between 35 Hz to 2.09 kHz. Detector 30 provides a DC output signal to gain control input 16 of variable gain element 14 having a level related to the RMS value of the output signal of BPF 28. The output signal of clipper 24 is also applied to a spectral control circuit comprising BPF 32 and RMS detector 34. BPF 32 has a passband between 8 kHz and 21 kHz. Detector 34 provides a DC output signal to gain control input 20 of variable preemphasis circuit 18 having a level related to the RMS value of the output signal of BPF 32.

Figure 3:
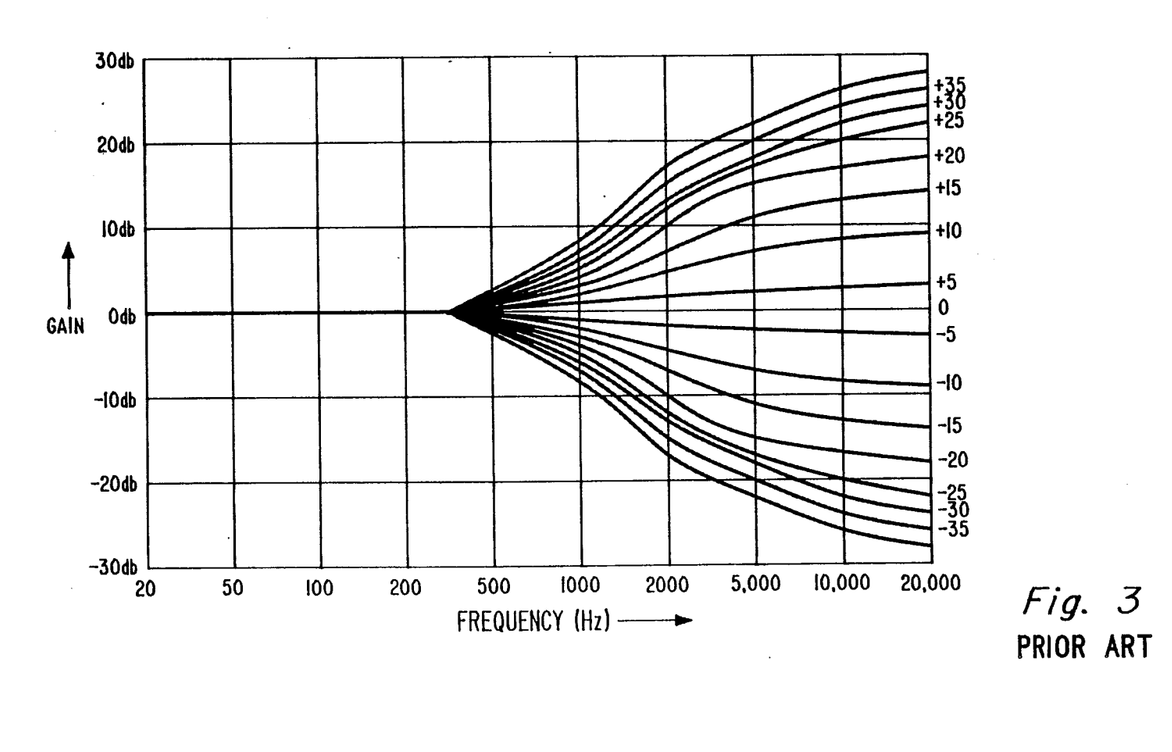
FIG. 3 is a graph of the gain versus frequency characteristics useful in understanding the compressor shown in FIG. 1 and the expander shown in FIG. 2.

FIG. 3 is a graph useful in illustrating the operation of variable preemphasis circuit 18 of FIG. 1. Variable preemphasis circuit 18 provides amplification or attenuation of the output signal of fixed preemphasis circuit 12, depending on the signal level at the output of clipper 24, for the reasons explained below. In FIG. 3, the vertical axis corresponds to the gain of variable preemphasis circuit 18 and the horizontal axis corresponds to frequency. The curves represent the gain for various values of gain control voltage at gain control input 20. The high frequency gain range extends from about $-35$ db to $+35$ db.

The transmitter includes a compressor for each of the L−R and SAP audio signals.

The transmitter also includes a channel for the L+R audio signal. However, the L+R audio signal is not compressed so as not to disturb the reproduction of monaural signals in receivers as explained above; it is however, preemphasized with a 75 μs network in accordance with present FCC standards.

The output signals at output terminals 26 of the respective compressors for the L−R and SAP audio signals and the output signal of the L+R channel are coupled to the modulator section of the transmitter (not shown) arranged according to the "Zenith System". The modulator section includes an AM modulator for producing an amplitude modulated version of the L−R signal having a suppressed subcarrier frequency at $2f_H$ (31.5 kHz for the NTSC standard used in the United States) The SAP signal is applied to an FM modulator to produce an FM signal having a subcarrier at $5f_h$. A pilot signal at $f_H$ for demodulating the L−R signal is also generated. The sum of the preemphasized L+R signal, the AM subcarrier carrying the L−R signal, the SAP FM subcarrier, and the pilot signal, is applied to the main FM modulator.

Figure 4:
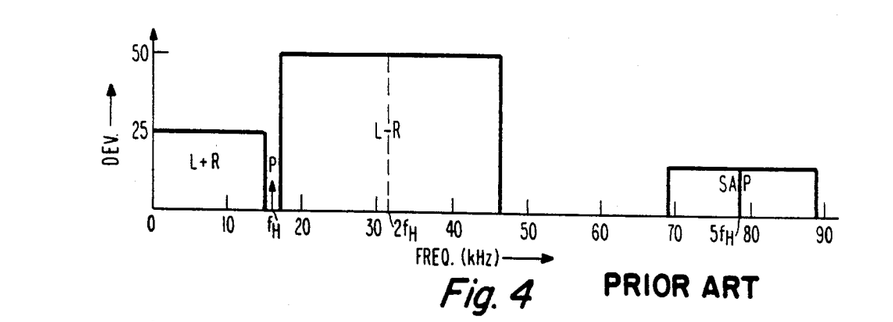
FIG. 4 is a graph of a frequency spectrum useful in understanding the "Zenith" television stereo transmission system.

FIG. 4 shows a frequency spectrum indicating the frequency modulation operation of the FM modulator of the transmitter. In FIG. 4 the horizontal axis corresponds to the frequency, in kHz, of the input signals to the modulator while the vertical axis represents frequency deviation, also in kHz, of the output signals of the modulator. The L+R signal has 15 kHz bandwidth and modulates the main carrier with peak deviation of a 25 kHz deviation, i.e., it is the conventional NTSC sound signal. The L−R signal has a 30 kHz bandwidth centered at a $2f_H$ suppressed carrier (shown by a dotted line) and modulates the main carrier with a 50 kHz deviation. The SAP signal has a 20 kHz bandwidth centered at subcarrier $5f_H$ and modulates the main carrier with a 15 kHz deviation. The pilot signal (indicated by a "P") is at $f_H$ and modulates the main carrier with a 5 kHz deviation.

Figure 2:
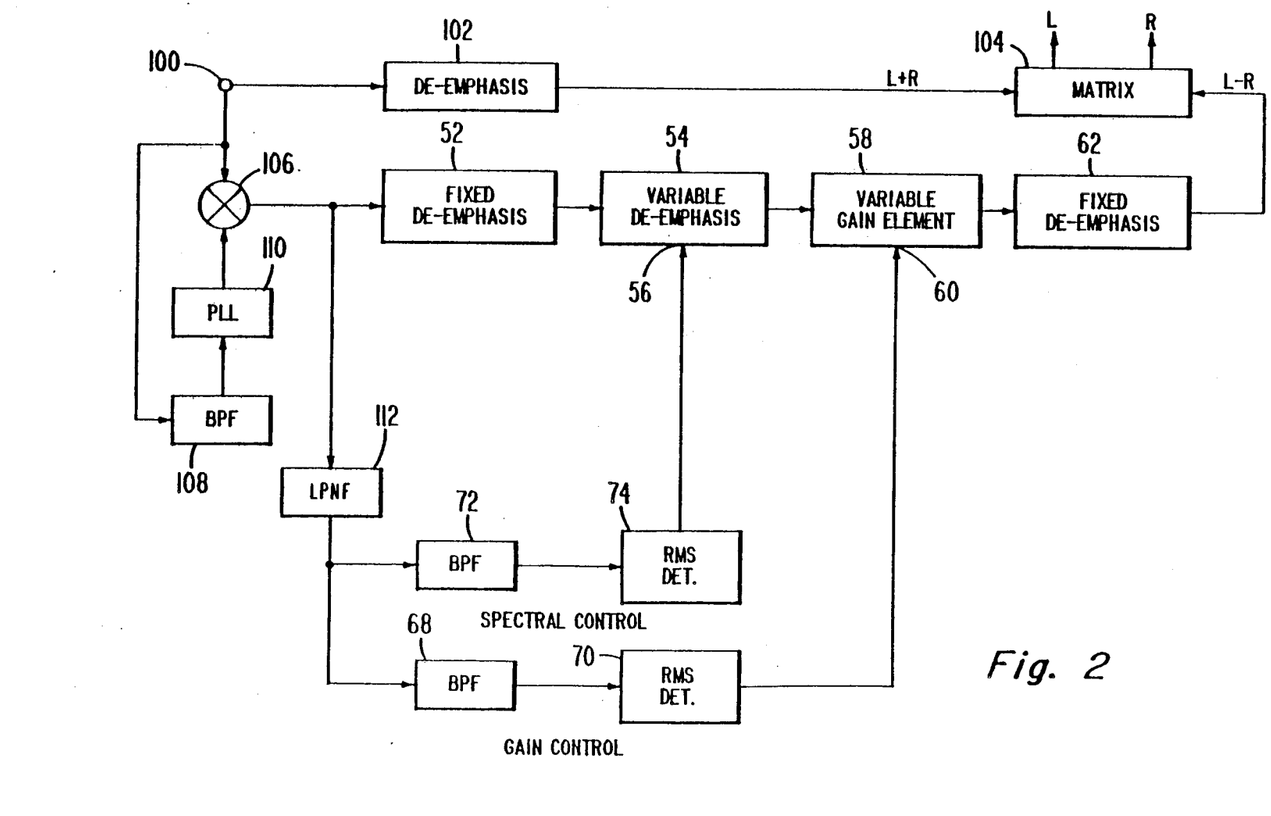
FIG. 2 is a block diagram of an expander constructed in accordance with the invention.

FIG. 2 shows an embodiment of an expander constructed in accordance with the invention. A demodulated FM signal having the components described above and shown in FIG. 4 is received at input terminal 100. The demodulated signal is applied to deemphasis circuit 102 of a L+R signal processing channel having the same time constant of 75 μs as used in the transmitter mentioned above. The output signal of deemphasis circuit 102 is applied to a stereo matrix circuit 104.

Figure 5:
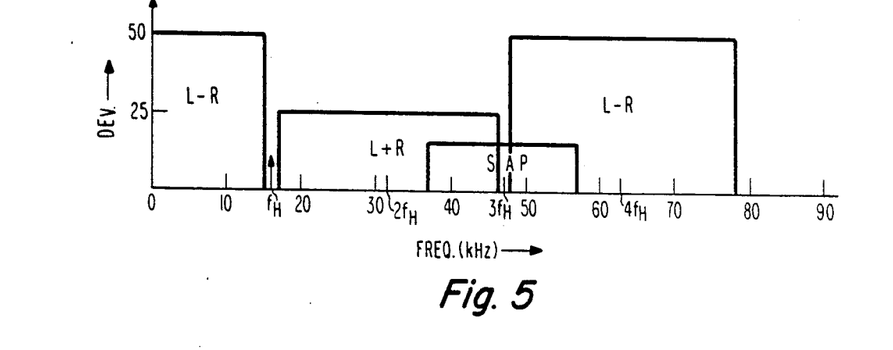
FIG. 5 is a graph of a frequency spectrum resulting from the demodulation process for the L−R signal useful in understanding the invention.

The signal at terminal 100 is also applied to mixer 106 and BPF 108 of a demodulator for the L−R signal. BPF 108 extracts the $f_H$ pilot signal which is applied to phase-locked-loop (PLL) 110. PLL 110 supplies a $2f_H$ signal to mixer 106. Mixer 110 performs frequency addition and subtraction. The frequency spectrum of some of the output signals of mixer 106 are shown in FIG. 5. In particular, the difference version of the L−R signal is now at baseband, the pilot signal is still at $f_H$, a sum version of the L+R signal is centered at $2f_H$, a difference version of the SAP signal is centered at $3f_H$, and a sum version of the L−R signal is centered at $4f_H$. Still other output signals can be produced. Thus, a large number of unwanted signals, i.e., signals other than the desired L−R baseband signal, are produced at the output of mixer 106.

The output signals of mixer 106 are applied to fixed deemphasis circuit 52 having a time constant of 73.5 μs. Fixed deemphasis circuit 52 performs amplitude versus frequency shaping which is the complement of that provided by fixed preemphasis circuit 22 of the compressor shown in FIG. 1. The output signal of fixed deemphasis circuit 52 is applied to variable deemphasis circuit 54 having associated control input 56. Variable deemphasis circuit 54 operates in complementary fashion to variable preemphasis circuit 18 of the compressor shown in FIG. 1 and thereby restores the original balance between low and high frequency components. The output signal of variable deemphasis circuit 54 is applied to variable gain element 58 having a gain control input 60. Variable gain element 58 provides "wideband" expansion of the dynamic range of the signal by the same amount as it was compressed by variable gain element 14 of the compressor so that, e.g., a compressed 50 db dynamic range signal is expanded again to have a dynamic range of 100 db. The output signal of variable gain element 58 is applied to fixed deemphasis circuit 62, which deemphasizes signal components with frequencies above about 400 Hz and performs amplitude versus frequency shaping which is complementary to that of preemphasis circuit 12 of the compressor of FIG. 1. The output signal from deemphasis circuit 62 is coupled to matrix 104 where it is combined with the L+R signal to form L and R signals.

The output signal of mixer 106 is also applied to gain and spectral control circuits (described below) through a low-pass filter (LPNF), i.e. a low-pass filter having a notch 112 the purpose of which will be described below. Specifically, the output signal of LPNF 112 is applied to a gain control circuit comprising BPF 68 having a passband from 35 Hz to 2.09 kHz and RMS detector 70. The output signal from detector 70 is a DC signal having a level related to the RMS value of the output signal to BPF 68 and is applied to gain control input 60 of variable gain element 58. The output signal of LPNF 112 is also applied to a spectral control circuit comprising BPF 72 having a passband between 8 kHz and 21 kHz and an RMS detector 74 which generates a DC output signal with a level related to the RMS value of its input signal. This DC output signal is applied to gain control input 56 of variable deemphasis circuit 54.

In general, in a companding system, at the transmitter, weak signal portions are amplified by a greater amount than strong signal portions. At the receiver, the converse operation is performed so that the original dynamic range of the compressed audio signal is restored by attenuating the received signal in inverse relationship to its strength. Thus, the noise introduced in the transmission channel is significantly attenuated and therefore made less perceptible, when the original audio signal is weak. When the original audio signal is strong, both the audio signal and noise are expanded. However, the noise is now less perceptible since it is masked by the strong audio signal. The wideband portion of the compressor shown in FIG. 1 comprising variable gain element 16, BPF 28 and RMS detector 30 and the wideband portion of the expander shown in FIG. 3 comprising variable gain element 58, BPF 68 and RMS detector 70 are used for the above described purpose.

In the companding system, to further improve noise performance in the compressor shown in FIG. 1, a spectral compressor comprising fixed preemphasis circuit 12, variable preemphasis circuit 18, BPF 32 and RMS detector 34, is used to provide relatively constant high amplitude high frequency content for transmitted signals since it has been found that noise is effectively masked under these conditions. To provide the desired level of high frequency content for strong high frequency audio signals, variable preemphasis circuit 18 has attenuation characteristics to compensate for the preemphasis provided by fixed preemphasis circuit 12. In the expander shown in FIG. 2, a spectral expander comprising fixed deemphasis circuit 52, variable deemphasis circuit 54, BPF 72 and RMS detector 74, is used to restore the high frequency content of the received audio signal to its original level. For this purpose, variable deemphasis circuit 54 can amplify or attenuate the high frequency of the output signal of fixed deemphasis circuit 52 as is indicated by the gain characteristics shown in FIG. 3.

As earlier noted, LPNF 112 is provided at the input of the wideband and spectral control circuitry. The purpose of LPNF 112 will now be explained. In the absence of LPNF 112, because the output signal of mixer 106 includes unwanted components in addition to the L−R signal (as described above in conjunction with FIG. 5), the operation of the expander cannot exactly track the operation of the compressor. To overcome this problem, it has been proposed to add a filter between mixer 106 and fixed deemphasis circuit 52 to reduce the amplitude of all components other than the L−R signal from the L−R channel. However, it is then necessary to add another filter in the L+R signal processing channel that matches the amplitude and phase characteristic of the filter added to the L−R signal processing channel in order to maintain adequate stereo separation. This is expensive as explained above. However, it is herein recognized that the unwanted signals need not be eliminated from the L−R channel but only from the control signal paths of the L−R expander. In accordance with the present invention, low-pass notch filter (LPNF) 112 is coupled to the inputs of BPFs 68 and 72. LPNF 112 passes the baseband L−R signal present at the output of mixer 106 and attenuates the signals other than the L−R signal. Accordingly, the "wideband" gain control and spectral control circuits will not respond to the unwanted products of mixer 106 and more nearly complementary tracking of the expander with respect to that of the compressor will result. Moreover, since LPNF 112 is not in the L−R signal path, no matching filter is required in the L+R signal path.

Figure 6:
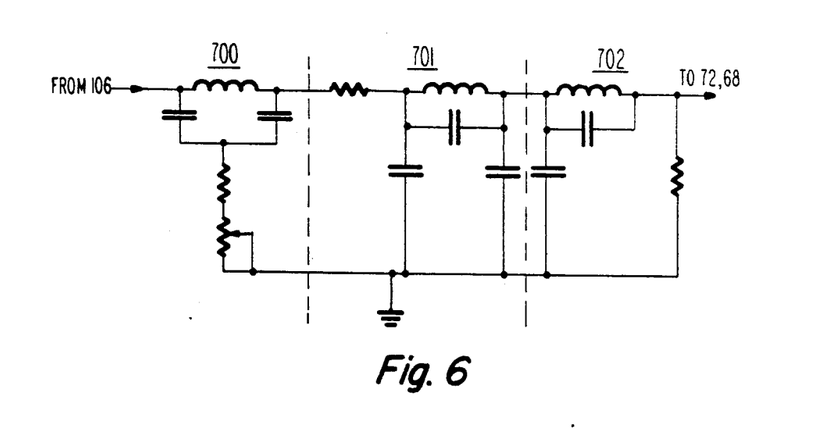
FIG. 6 is a detailed schematic of an implementation of a filter used in the expander shown in FIG. 3.

It will be noted that since filter 112 is not in the L−R audio signal path, the unwanted signals as shown in FIG. 6 will be applied to matrix 104. Further, it is noted that the signals in the L+R signal path include unwanted signals, in particular the pilot, L−R, and SAP signals as shown in FIG. 4 and these unwanted signals will also reach matrix 104. However, the unwanted signals in both the L−R and L+R signal paths are in the ultrasonic frequency range, and thus are inaudible. In addition the unwanted signals are attenuated due to the use of deemphasis circuits 52 and 102, which provide at least 17 db of attenuation at 15 kHz.

As earlier noted, BPF 68 has a passband from 35 Hz to 2.09 kHz, BPF 72 has a passband from 8 to 21 kHz. Therefore, LPNF 112 is most helpful with respect to the complementary operation of the spectral expander since BPF 68 of the "wideband" expander significantly attenuates the unwanted signals. In this vein, while BPF 72 does provide some attenuation of the unwanted signals above 21 kHz, in practice this attenuation was found insufficient.

Except for LPNF 112, circuit details of the compressor and expander can be found in the aforementioned EIA report and also in U.S. patent application "Apparatus For Reducing the Effects of Noise Interference in Audio Companding System" Ser. No. 593,967 filed in the name of M. W. Muterspaugh on Mar. 27, 1984 and assigned to the same assignee as the present invention.

Figure 7:
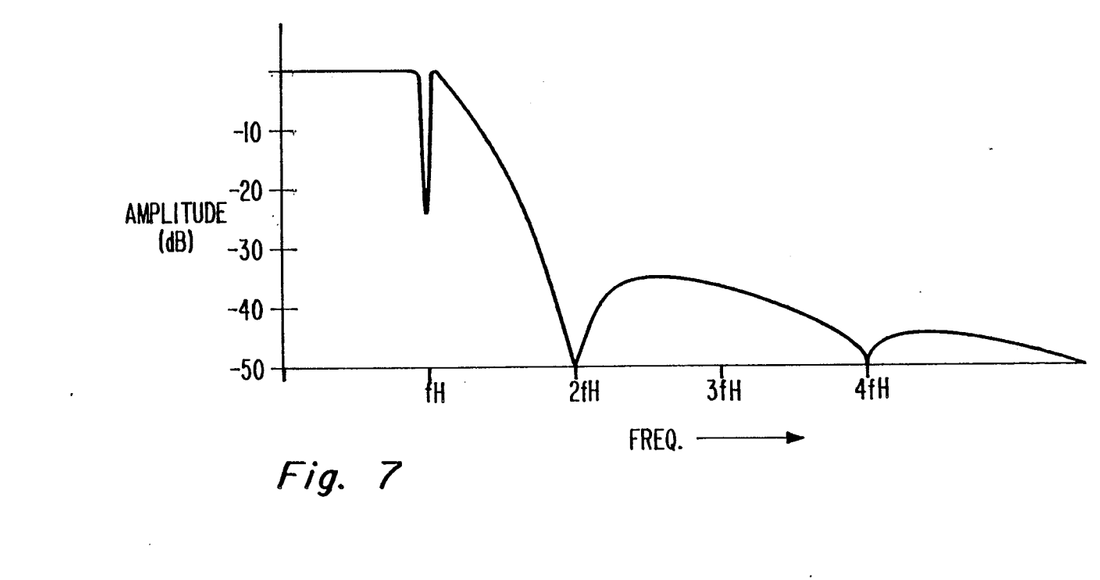
FIG. 7 is an amplitude versus frequency characteristic of the filter shown in FIG. 6.

FIG. 7 is a circuit diagram of LPNF 112. A similar filter is described in the publication "Supplement to Multichannel Television Sound Report", Vol. IA, IIA, dated Dec. 5, 1983, p. 23, FIG. 1, published by the Electronic Industries Association. As explained on p. 19 of said publication, a matching pair of such filters are proposed for use in the L+R and L−R channels respectively to remove the unwanted signals described with reference to FIG. 5. In LPNF 112 shown in FIG. 6, section 700, provides a rejection notch at 15.75 kHz ($1f_H$), the variable resistor being adjusted for maximum notch depth. Section 701 provides a rejection notch at 31.5 kHz ($2f_H$), and section 702 provides a rejection notch at $4f_H$. The amplitude versus frequency characteristics of LPF 112 are shown in FIG. 7. As can be seen from the spectrum of the interferring signals shown in FIG. 5, the notches or nulls of LPNF 112 correspond to the frequencies of the $f_H$ pilot signal, the $2f_H$ suppressed carrier of the L+R component, and the $4f_H$ center frequency of the L−R component. The phase characteristic of LPNF 112 is not important because the RMS detectors in the control signal path do not detect phase information.

In theory, in order to maintain exactly complementary compression and expansion characteristics, a filter identical to LPNF 112 is required at a corresponding position in the control loop of the compressor. Unfortunately, the exact circuitry, and hence, characteristics of LPNF 112 will, in practice, vary with different models of receivers. Thus, exact matching at the transmitter will not in general be possible. However, it has been found that due to the relatively long time constants of the RMS detectors, which time constants are long compared with the delay of a filter corresponding to LPNF 112 in the compressor, such a filter is not needed.

It will be appreciated that other embodiments are possible. For example, LPNF 112 can be placed between BPF 72 and detector 74, and thus be part of a single design of BPF 72. However, this has the disadvantage that BPF 68, although it attenuates resonably well the interferring signals, will not have the benefit of LPNF 112, which is designed specifically to attenuate the interferring signals.

What is claimed is:

1. A channel for processing a received signal containing at least two components in different frequency ranges representing audio information comprising:
   mixer means for demodulating said received signal to produce an audio signal including high frequency components and unwanted signal components;
   fixed filter means for deemphasizing high frequency components of signals produced by said mixer means occupying a first frequency range;
   variable filter means for controlling the amplitude of signals produced by said fixed filter means in said first frequency range in response to a first control signal;
   variable gain means for controlling the amplitude of signals from said fixed filter means in a second frequency range in response to a second control signal;
   first control means, including first filter means, for generating said first control signal in response to said audio signal;
   second control means, including second filter means, for generating a second control signal in response to said audio signal; and
   additional filter means conveying signals produced by said mixer means to said first and second control means for limiting the amplitude control provided by said variable filter means in response to said unwanted signal without limiting the amplitude control provided by said variable filter means in response to said audio signal.

2. The apparatus recited in claim 1 wherein:
   said variable gain means is coupled in cascade with said variable filter means for controlling the amplitude of signals from said variable filter means in said second frequency range wider than and including said first frequency range in response to said second control signal.

3. The apparatus recited in claim 2 wherein:
   said fixed filter means deemphasizes said audio signal.

4. The apparatus recited in claim 3 wherein:
   said additional filter means is coupled between said mixer means and said first and second control means.

5. The apparatus as claimed in claim 1, wherein:
   said received signal includes a baseband L+R signal and a higher frequency L−R signal;
   said mixer means produces an L−R baseband signal; and
   said additional filter means comprises a low pass notch filter having rejection nulls at a television horizontal frequency, twice said horizontal frequency, and four times said horizontal frequency.

6. The apparatus recited in claim 1 wherein:
   said received signal includes a baseband L+R signal and a higher frequency L−R signal;
   said mixer means produces an L−R baseband signal; and
   said additional filter means substantially limits the response of said first control means fo signals within the bandwidth of said L−R baseband signal.

7. The apparatus recited in claim 2 wherein:
   said first frequency range is approximately between 400 Hz and 15 kHz.

8. Apparatus for expanding an input signal containing at least two components in different frequency ranges representing audio information comprising:
   mixer means for demodulating said input signal to produce an audio signal corresponding to one of said components and an unwanted signal;
   a fixed deemphasis circuit receiving said audio signal for deemphasizing high frequency components of said audio signal to produce an output signal;
   a variable filter circuit for modifying the amplitude of the high frequency components of the output signal of said fixed deemphasis circuit in response to a control signal to produce another output signal;
   control means responsive to said output signal of said mixer means for generating said control signal; and
   additional filter means coupled to said control means for limiting the amount of amplitude control provided by said variable filter means in response to said unwanted signal without limiting the amplitude control provided by said variable filter means in response to said audio signal; wherein
   said audio signal comprises a stereophonic difference signal; and
   said additional filter means comprises a low pass notch filter having nulls at a television horizontal frequency, twice said horizontal frequency, and four times said horizontal frequency.

9. Apparatus for expanding an input signal containing at least two components in different frequency ranges representing audio information comprising:
   mixer means for demodulating said input signal to produce an output signal containing an audio signal corresponding to one of said components and an unwanted signal;
   a fixed deemphasis circuit receiving said audio signal for deemphasizing high frequency components of said audio signal to produce an output signal;
   a variable filter circuit for modifying the amplitude of the high frequency components of said output signal of said fixed deemphasis circuit in response to a first control signal to produce another output signal;
   first control means, including bandpass filter means, responsive to said output signal of said mixer means for generating said first control signal; and
   additional filter means coupled between said mixer means and said bandpass filter means for limiting the amount of amplitude control provided by said variable filter means in response to said unwanted signal without limiting the amplitude control provided by said variable filter means in response to said audio signal.

10. Apparatus as claimed in claim 9 wherein:
there is further provided variable gain means coupled in cascade with said variable filter means for modifying the amplitude of frequency components of its input signal in a relatively broad frequency range encompassing said high frequency components of said audio signal in response to a second control signal; and
second control means responsive to said output signal of said mixer means for generating said second control signal.

11. Apparatus as claimed in claim 10 wherein:
each of said first and second control means compises a bandpass filter and an RMS detector coupled in the order named, said first and second control signals being produced at the output of respective ones of said RMS detectors; and
said additional filter means is coupled between said mixer means and each of said bandpass filters.

12. Apparatus as claimed in claim 9, wherein:
said audio signal comprises a stereophonic difference signal.

13. Apparatus comprising:
a source of an input signal including at least an L+R baseband component, a pilot signal, a non-baseband L−R component and a non-baseband SAP component;
demodulation means for mixing said input signal with a local oscillator signal having a frequency proportional to that of said pilot signal to produce an L−R baseband signal along with unwanted sum and difference frequency products of said local oscillator signal and said L+R and SAP components;
an expander having an audio signal processing path for processing the output signals of said demodulation means in response to a control signal and a control signal path for generating said control signal; and
filter means disposed in said control signal path but not in said audio signal path for reducing the sensitivity of the expander to said unwanted sum and difference frequency products.

14. The apparatus recited in claim 13, wherein:
said pilot signal has a frequency of $f_H$, said L−R component has a suppressed carrier at $2f_H$ and said SAP component has a carrier at $5f_H$;
said local oscillator signal has a frequency equal to $2f_H$; and
said filter comprises a low-pass notch filter having nulls at $f_H$, $2f_H$ and $4f_H$.

15. Apparatus for processing a compressed received signal having a baseband stereophonic sum signal and a modulated stereophonic difference signal, comprising:
a mixer having an input receiving said received signals and an output providing a baseband difference signal and unwanted signals;
an expander coupled to said mixer output for expanding said baseband difference signal in accordance with a control signal to produce an expanded signal;
a control signal generating means coupled to said expander; and low-pass notch
filter means coupled between said mixer and said control signal generating means for attenuating said unwanted signals without substantially attenuating said baseband difference signal.

16. Apparatus as claimed in claim 15, further comprising:
matrix means for matrixing the expanded signal and said baseband sum signal to produce left and right signals.

* * * * *